US008555209B2

(12) United States Patent  (10) Patent No.: US 8,555,209 B2
Chung  (45) Date of Patent: Oct. 8, 2013

(54) METHOD FOR FABRICATING A SEMICONDUCTOR DEVICE USING A MODELING ALGORITHM TO MODEL THE PROXIMITY EFFECT FROM THE SUB-LAYER

(75) Inventor: No Young Chung, WhaSung (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 42 days.

(21) Appl. No.: 13/021,367

(22) Filed: Feb. 4, 2011

(65) Prior Publication Data

US 2012/0204135 A1    Aug. 9, 2012

(51) Int. Cl.
*G06F 17/50*    (2006.01)

(52) U.S. Cl.
USPC .............................................. 716/53; 716/55

(58) Field of Classification Search
USPC ..................................................... 716/51–55
See application file for complete search history.

(56) References Cited

U.S. PATENT DOCUMENTS

| 7,458,056 | B2 * | 11/2008 | Pierrat | 716/53 |
| 2006/0085773 | A1 * | 4/2006 | Zhang | 716/4 |
| 2006/0236271 | A1 * | 10/2006 | Zach | 716/1 |
| 2007/0100591 | A1 * | 5/2007 | Harazaki | 703/2 |
| 2008/0301620 | A1 * | 12/2008 | Ye et al. | 716/19 |

* cited by examiner

*Primary Examiner* — Binh Tat
(74) *Attorney, Agent, or Firm* — F. Chau & Associates, LLC (57) ABSTRACT

A method for forming a circuit layout comprises performing process proximity effect modeling based on process proximity effects caused by a sub-layer, wherein the sub-layer comprises an active layer positioned under a gate poly, and wherein performing the process proximity effect modeling includes calculating a pattern density of the sub-layer, incorporating results of the process proximity effect modeling into a modeling algorithm, and performing proximity correction using the results to manipulate a layout of a mask to be used when forming the circuit layout by photolithography.

26 Claims, 8 Drawing Sheets

METHOD FOR FABRICATING A SEMICONDUCTOR DEVICE USING A MODELING ALGORITHM TO MODEL THE PROXIMITY EFFECT FROM THE SUB-LAYER

BACKGROUND

1. Technical Field

The present disclosure relates to a method for fabricating a semiconductor device, and, more specifically, to a method for fabricating a semiconductor device using a modeling algorithm to model the proximity effect from the sub-layer on the critical dimensions on a wafer.

2. Discussion of the Related Art

Various circuit elements, such as transistors having a gate disposed between source and drain regions, are integrated in semiconductor devices manufactured by photolithography. Photolithography is a process used in microfabrication of integrated semiconductor devices by using light to transfer a geometric pattern from a photo mask to a light-sensitive chemical photoresist on the substrate. As a circuit pattern to be formed on a wafer is increasingly smaller in size, it becomes more difficult to form a design pattern to the desired shape and dimensions on the wafer. As a result of the miniaturization of the mask pattern, any deviations of the path of light due to a variety of processing conditions, known as optical proximity effects (OPE) or process proximity effects (PPE), become enhanced, and require correction.

In order to limit an influence of the OPE or PPE, optical proximity correction (OPC) or process proximity correction (PPC) is performed, which are techniques of forming the designed resist patterns by using corrected photo masks that are adjusted based on an error calculation. The error calculation may be arrived at through modeling the optical and process proximity effects using algorithms which incorporate various simulation parameters related to, for example, the light sources and the resists being used. Use of OPC/PPC makes it possible to suppress unwanted fluctuations of a critical dimension (CD) on the wafer, such as, for example, line widths that are narrower or wider than designed, so that the original designed layout or as close to the original designed layout as is possible can be reproduced in the wafer.

Conventional modeling algorithms use simulation parameters that address the field and gate polysilicon layers themselves. However, none of known the modeling algorithms use parameters based on the characteristics of an active layer (referred to as a sub-layer) positioned below a gate polysilicon layer.

Accordingly, a need exists for modeling algorithms for modeling proximity effects which take into account the impact from sub-layers, such as an active layer positioned below a gate polysilicon layer.

SUMMARY

A method for forming a circuit layout, according to an embodiment of the inventive concept, comprises performing first proximity effect modeling based on photolithography proximity effects caused by a first layer, wherein the first layer comprises a gate poly and a field poly formed on a substrate, performing second proximity effect modeling based on photolithography proximity effects caused by a second layer, wherein the second layer comprises an active layer positioned under the gate poly, and wherein performing the second proximity effect modeling includes calculating a pattern density of the active layer, combining results of the first and second proximity effect modeling using a modeling algorithm, and performing proximity correction using the combined results to manipulate a layout of a mask to be used when forming the circuit layout by photolithography.

Calculating the pattern density may be performed using a top hat density kernel or a Gaussian density kernel, and may be performed with respect to a predetermined point on the gate poly.

The first proximity effect modeling may include modeling optical and resist properties, wherein the optical properties include at least one of a type of a light source, a shape of the light source, a scanner pupil shape and a diffusion length, and the resist properties include at least one of a mask transmissivity and an acid/base concentration of the resist process.

The combined results of the first and second proximity effect modeling may be stored in a memory. The method may further comprise inputting the circuit layout to a processor, generating a target based on the inputted circuit layout, performing the proximity correction on the generated target; and outputting the manipulated mask layout.

The proximity correction may be at least one of process proximity correction or optical proximity correction, and the first and second proximity effect modeling are at least one of process proximity effect modeling or optical proximity effect modeling.

According to an embodiment of the inventive concept, a computer program product is embodied in one or more computer readable mediums having computer readable program code embodied thereon to perform a method for forming a circuit layout, wherein the method comprises performing first proximity effect modeling based on photolithography proximity effects caused by a first layer, wherein the first layer comprises a gate poly and a field poly formed on a substrate, performing second proximity effect modeling based on photolithography proximity effects caused by a second layer, wherein the second layer comprises an active layer positioned under the gate poly, and wherein performing the second proximity effect modeling includes calculating a pattern density of the active layer, and combining results of the first and second proximity effect modeling using a modeling algorithm, and performing proximity correction using the combined results to manipulate a layout of a mask used when forming the circuit layout by photolithography.

A method for forming a circuit layout, according to an embodiment of the inventive concept, comprises performing process proximity effect modeling based on process proximity effects caused by a sub-layer, wherein the sub-layer comprises an active layer positioned under a gate poly, and wherein performing the process proximity effect modeling includes calculating a pattern density of the sub-layer, incorporating results of the process proximity effect modeling into a modeling algorithm, and performing proximity correction using the results to manipulate a layout of a mask to be used when forming the circuit layout by photolithography.

A computer system, according to an embodiment of the inventive concept, comprises a semiconductor device having a circuit layout manufactured by a method according to at least one embodiment of the inventive concept, wherein the computer system is a personal computer (PC), a personal digital assistant (PDA), an MP3 player, a digital audio recorder, a pen-shaped computer, a digital camera, or a video recorder.

A system for transmitting or receiving data, according to an embodiment of the inventive concept, comprises a memory device for storing a program, and a processor in communication with the memory device, wherein the memory device comprises a circuit layout manufactured by a method according to at least one embodiment of the inventive concept.

The system may comprise at least one of a mobile system, a portable computer, a web tablet, a mobile phone, a digital music player, or a memory card.

A semiconductor memory card, according to an embodiment of the inventive concept, comprises an interface part that interfaces with an external device, a controller that communicates with the interface part and a memory device via address and data buses, wherein the memory device comprises a circuit layout manufactured by a method according to at least one embodiment of the inventive concept.

BRIEF DESCRIPTION OF THE DRAWINGS

Exemplary embodiments of the present inventive concept will be described below in more detail, with reference to the accompanying drawings, of which.

DETAILED DESCRIPTION OF THE EMBODIMENTS

Exemplary embodiments of the present inventive concept now will be described more fully hereinafter with reference to the accompanying drawings. This inventive concept may, however, be embodied in many different forms and should not be construed as limited to the embodiments set forth herein.

As will be appreciated by one skilled in the art, aspects of the present inventive concept may be embodied as a system, method or computer program product. Accordingly, aspects of the present inventive concept may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present inventive concept may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a RAM, a ROM, an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present inventive concept may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present inventive concept are described with reference to flowchart illustrations and/or block diagrams of methods, apparatus (systems) and computer program products according to embodiments of the inventive concept. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article or manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present inventive concept. In this regard, each block in the flowchart or block diagrams may represent a module, segment, or portion of code, which comprises one or more executable instructions for implementing the specified logical functions(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present inventive concept has been presented for purposes of illustration and description, but is not intended to be exhaustive or limited to the inventive concept in the form disclosed. Many modifications and variations will be apparent to those of ordinary skill in the art without departing from the scope and spirit of the inventive concept. The embodiments were chosen and described in order to best explain the principles of the inventive concept and the practical application, and to enable others of ordinary skill in the art to understand the inventive concept for various embodiments with various modifications as are suited to the particular use contemplated.

Figure 1:
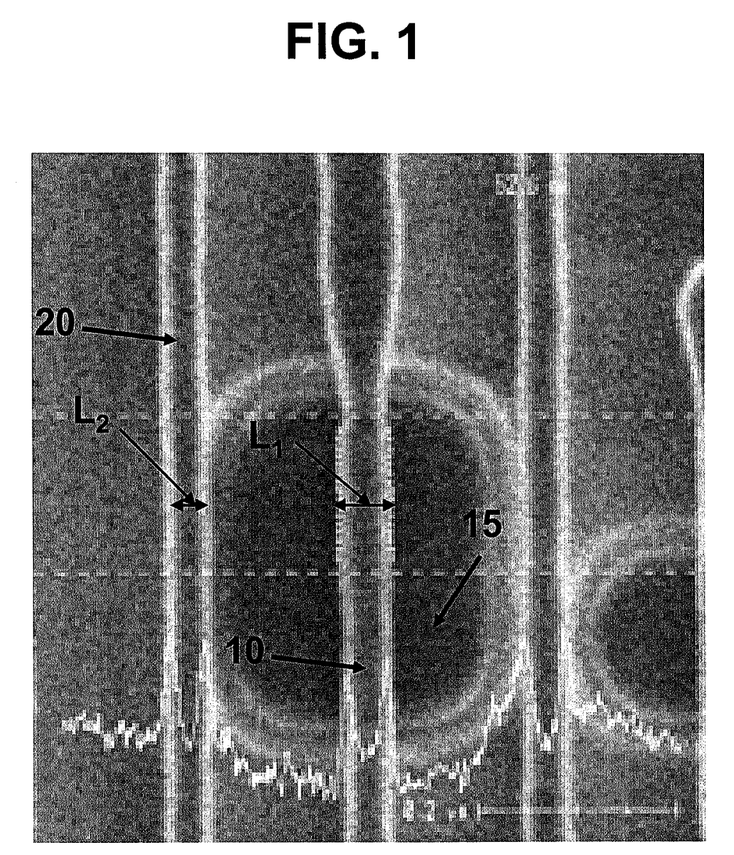
FIG. 1 is an image showing a critical dimension variation between a field poly with no sub-layer and gate poly having a sub-layer after etching of polysilicon.

FIG. 1 shows a magnified image of field polysilicon layers (referred to as "field polys") adjacent a gate polysilicon layer (referred to as a "gate poly"). As can be seen from FIG. 1, the line width ($L_1$) of the gate poly 10 is wider than the line width ($L_2$) of the field poly 20. The variation in this critical dimension (CD) is due to the presence of the sub-layer 15, which is the active layer under the gate poly 10. According to current modeling methods, there are no known modeling algorithms which model the impact of the sub-layer 15, and current modeling methods model only the OPE/PPE caused by the actual field and gate poly layers themselves.

Figure 2:
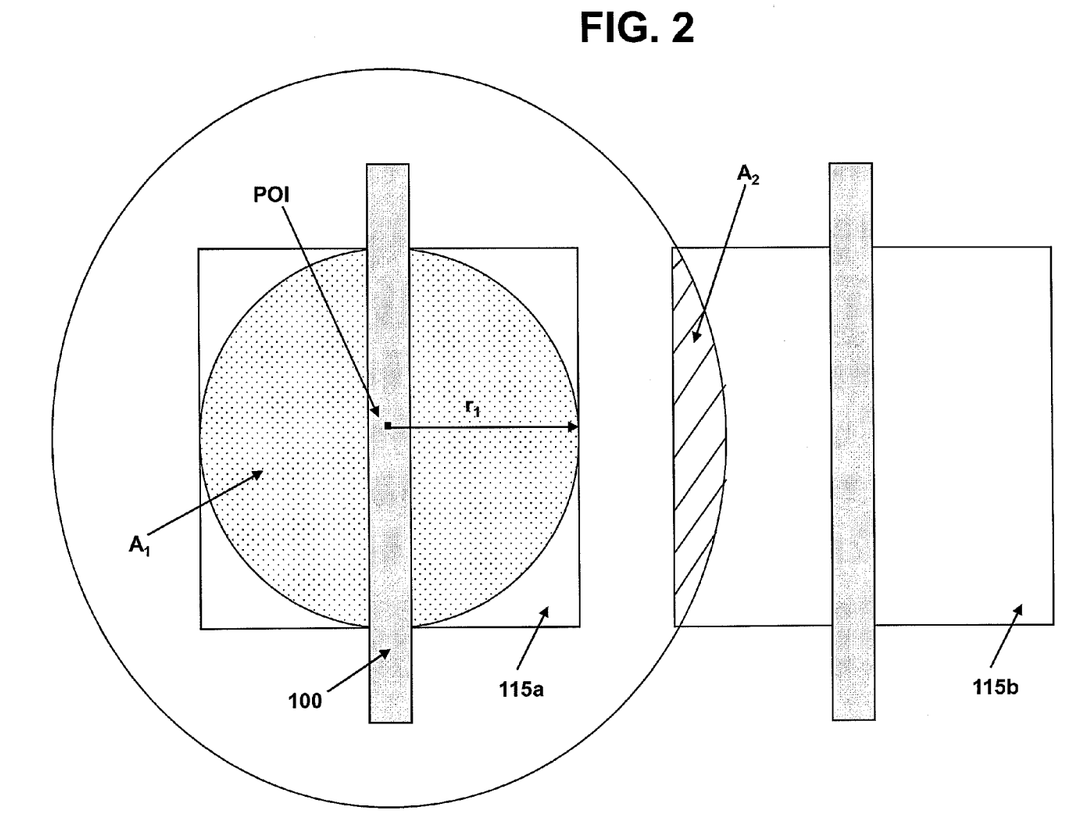
FIG. 2 is a diagram for explaining pattern density effect, according to an embodiment of the present inventive concept.

According to an embodiment of the present inventive concept, the effect of sub-layers on lithography and on the critical dimensions of a resulting poly is modeled based on the density of each sub-layer within a given area surrounding a particular point of interest (POI) on the poly. This is referred to as the pattern density effects of the sub-layers. For example, referring to FIG. 2, which is a diagram for explaining pattern density effect, it can be understood that the pattern density, and in turn, the pattern density effects of each successive sub-layer away from a point of interest (POI) progressively decreases. Referring to FIG. 2, the POI is designated on a poly 100 positioned over a first sub-layer 115a. The pattern density (S) is given by the following equation (1).

$$S = (\text{area of the sub-layer inside circle})/(\text{total circle area}) \quad (\text{Eq. 1}).$$

As can be seen with reference to Eq. 1, for a circle having a radius of $r_1$, which is the distance from the POI to the edge of the sub-layer 115a, the pattern density ($S_1$) of the sub-layer 115a is 1 because the area $A_1$ of the sub-layer 115a inside the circle is equal to the total circle area. According to this model, it can be seen that the pattern density effect of a second sub-layer 115b with respect to the POI is less than the pattern density effect of the first sub-layer 115a. The second sub-layer 115b is farther away from the POI and, therefore, has less impact on the critical dimensions of poly 100 than the first sub-layer 115a. In this instance, the pattern density $S_2$ is less than the pattern density $S_1$ because the area $A_2$ of the sub-layer 115b inside the second circle is less than the area $A_1$ of the sub-layer 115a inside the first circle, and also because the area of the second circle is larger than the area of the first circle. Accordingly, $S_1 > S_2 > S_3 > \ldots S_n$.

Figure 3A:
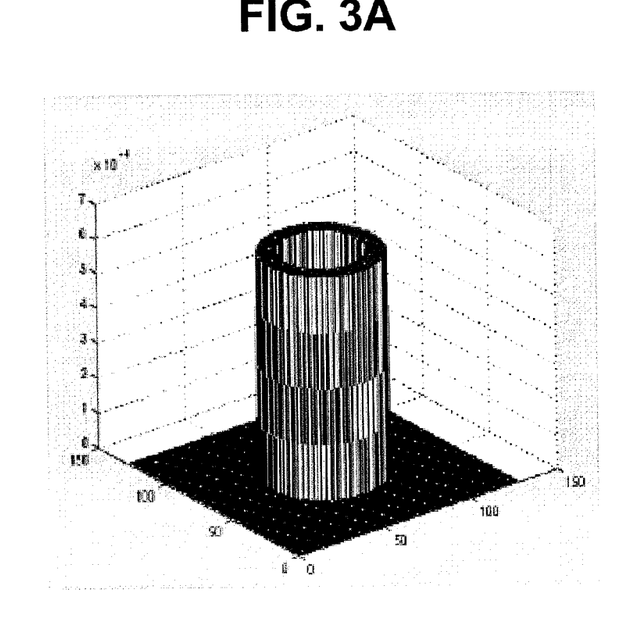
FIG. 3A shows a Top Hat density kernel, according to an embodiment of the present inventive concept.
Figure 3B:
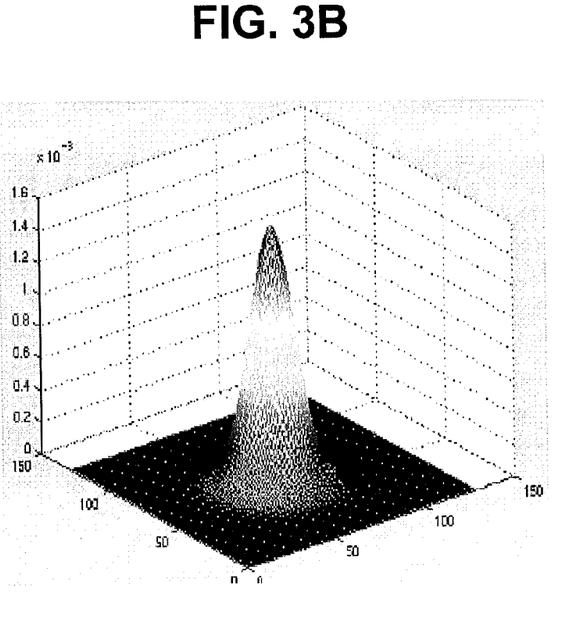
FIG. 3B shows a Gaussian density kernel, according to an embodiment of the present inventive concept.

A user performing OPC/PPC may choose from a plurality of density kernels to model the pattern density effects of the sub-layers 115a, 115b, 115c . . . $115_\infty$ with respect to a particular POI. As is understood by one of ordinary skill in the art, kernel density estimation is a data smoothing mechanism where inferences about a specific population are made based on a finite amount of data. In other words, kernel estimation puts a kernel (i.e., a type of distribution) on every point and sums it to construct the overall estimated distribution of the data based on a limited number of data points. Various density kernels, such as, for example, Top Hat, as shown in FIG. 3A, and Gaussian, as shown in FIG. 3B, are available to a user to create an estimated distribution of data. Therefore, using a chosen density kernel, or a plurality of density kernels, a user may calculate the pattern density effects of sub-layers with respect to a particular point of interest and incorporate these calculations into a modeling algorithm. According to an embodiment of the inventive concept, a user can measure the finite set of data points that form the basis for the estimated distribution of data with an in-line scanning electrode microscope (SEM) measurement tool.

An example modeling algorithm equation is shown by equation (2):

$$CD = c_0 + c_1 {}^* p_1 + c_2 {}^* p_2 + c_3 {}^* d_1 + c_4 {}^* d_2 + c_5 {}^* d_3 + \ldots + c_y {}^* d_y + c_n {}^* p_n \quad (\text{Eq. 2}),$$

where CD is a simulated critical dimension, and $p_1, p_2, \ldots p_n$ are simulation parameters related to optical properties, such as, for example, the type of light source, the shape of the light source, scanner pupil shape and diffusion length, and to resist properties, such as, for example, mask transmissivity and acid/base concentration of the resist process. Depending on conditions, $c_0, c_1, c_2$ and $c_n$ are coefficients for the particular simulation parameters, the coefficients being assigned based on how the simulation parameter affects CD. Therefore, the combinations of the coefficient and the simulation parameters are added together to determine an overall effect on CD. For example, the coefficients are chosen to minimize the cost function of the modeling CD_ertRrms, as set forth in the following equation (3):

$$errRrms = \sqrt{\frac{\sum_i PCW_i \frac{\sum_j W_{i,j}(EPE_{sim} - EPE_{meas})^2}{\sum_j W_{i,j}}}{\sum_i PCW_i}} \quad \text{(Eq. 3)}.$$

where $PCW_i$ is the Process Condition Weight for the given sample sheet $i$ and $W_{ij}$ is the weight for site $j$ within sample sheet $i$.

$EPE_{meas}$ is obtained from the wafer data measurement and $EPE_{sim}$ is calculated with the optimized coefficients. Therefore, the coefficients are used to calculate the $EPE_{sim}$ and the coefficients are optimized to minimize the cost function, errRrms.

Based on the type of density kernel defined by a user performing the OPC/PPC process, $d_1, d_2, d_3 \ldots d_y$ represent respective pattern densities of different sub-layers with respect to a particular point of interest (POI) and $c_3, c_4, c_5 \ldots c_y$ are coefficients used in the calculation of pattern density effect. According to an embodiment of the inventive concept, such coefficients $c_3, c_4, c_5 \ldots c_y$ are chosen and optimized to minimize the cost function, errRrms, as described above.

The pattern density effects of the sub-layers are modeled to obtain an accurate prediction of how the sub-layers affect CD of a given poly. The modeling of the pattern density of the sub-layers provides a method for taking into account a variety of factors that can influence CD, such as, for example, reflectivity, focus difference and etch skew bias, which are all impacted by the sub-layers. In more detail, modeling of the pattern density of the sub-layers minimizes reflectivity differences in block layers that can be used to expose or block specific portions of a photoresist layer to or from light, and minimizes etch skew differences in the mask layers used during the patterning processes. The focus difference is caused by the sub-layer integration. Accordingly, if the sub-layer's pattern density can be calculated, the correlation of the focus and the sub-layer's pattern density can be extracted to compensate for this focus difference from the sub-layer's impact. As a result, fluctuations of the critical dimensions of the wafer designs are minimized.

Figure 4:
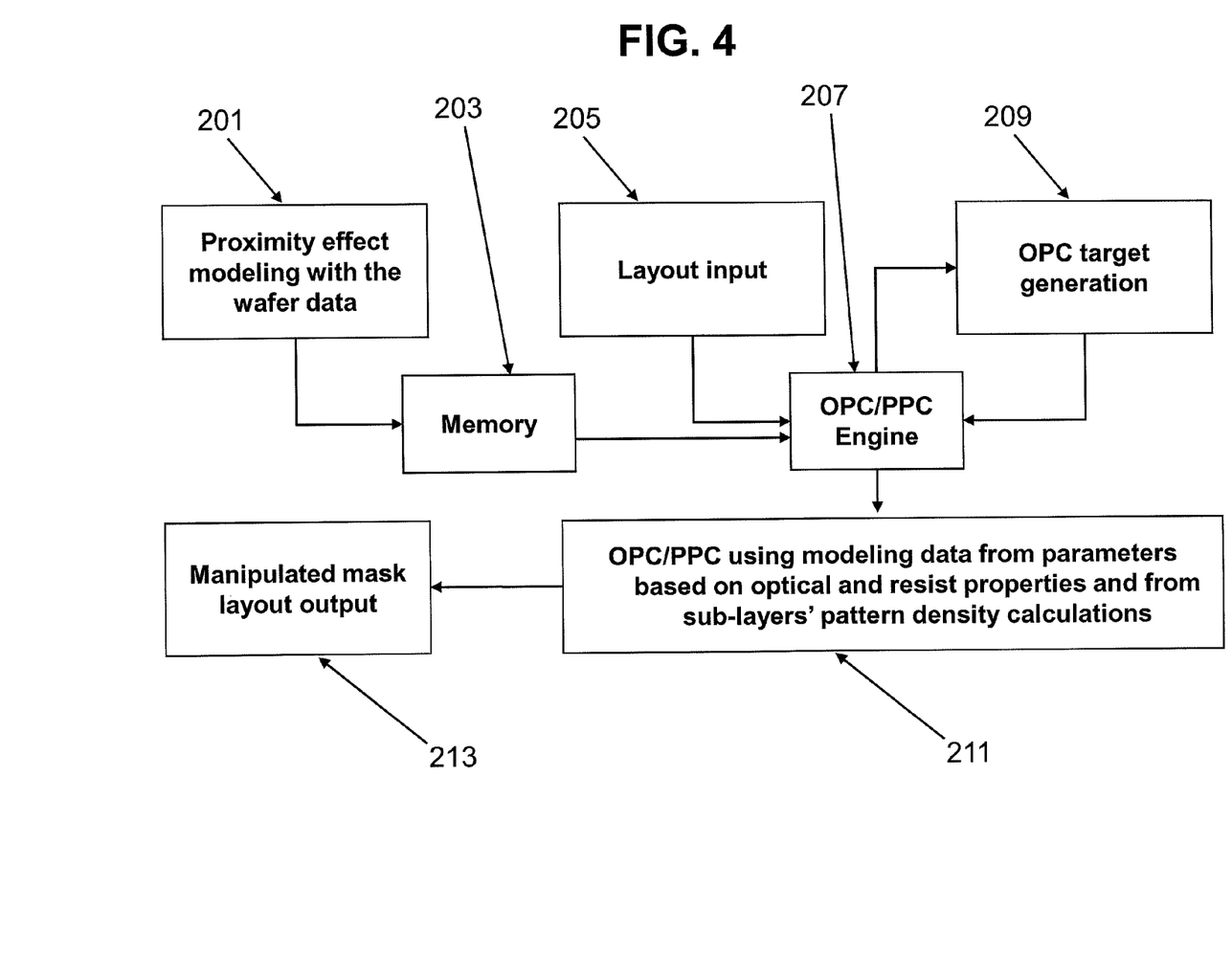
FIG. 4 is a block diagram showing a system for forming a layout of circuit elements on a substrate using optical/process proximity correction, according to an embodiment of the present inventive concept.

Referring to FIG. 4, a block diagram of a system for forming a layout of circuit elements on a substrate using optical/process proximity correction, according to an embodiment of the present inventive concept, is shown. As shown in FIG. 4, in a modeling step 201, optical/process proximity effect modeling based on wafer data, is performed. In this modeling step, in addition to the simulation parameters related to optical and resist properties based on the field and/or gate poly layers themselves, the sub-layers' optical/process proximity effects are also included in the modeling calculations. Accordingly, based on the configuration of the field and gate polys and the sub-layers, the effect of the sub-layers with respect to particular POIs is modeled using density kernels, such as the Top Hat and Gaussian density kernels. In other words, the pattern density of the sub-layers is calculated and is included in the modeling algorithm. The modeling data is stored in a memory 203 to be used during an OPC/PPC process.

Then, a series of OPC/PPC steps are performed, including inputting one or more layouts of an intended circuit pattern(s) (layout input 205) to an OPC/PPC engine 207 or some other processing unit, generating a plurality of OPC/PPC targets (OPC/PPC target generation 209) based on the layout input 205, performing OPC/PPC on the targets using modeling data derived from the simulation parameters based on optical and resist properties and from the sub-layers' pattern density calculations (block 211), and outputting the manipulated mask layout of the circuit pattern(s) based on the correction algorithm(s) (layout output 213). The outputted (corrected) mask layout is used in a photolithography process to form a desired layout of circuit elements on a substrate.

Since IC layouts are typically defined with shapes such as rectangles and 45° triangles, and limitations in the imaging process prevent the exact rendering of these shapes on the wafer, an OPC/PPC tool can interpret what should appear on the silicon by using OPC/PPC target generation 209. For example, an OPC/PPC tool may interpret a square corner as something more rounded by moving the target points for OPC/PPC off from the Graphic Database System (GDS) edges and onto mathematically described curves inscribed within the corners of the design polygon and use these as the target for OPC/PPC correction. Then, an OPC/PPC engine 207, or some other processing unit, performs OPC/PPC on the target(s) to determine if the target points are at a location which would result in the intended circuit pattern(s) or closest to the intended circuit pattern(s) being outputted onto the wafer. If the target points are not at the location to yield the desired result, the OPC/PPC process adjusts the location of the targets until an optimum location is obtained. In performing OPC/PPC on the targets, the OPC/PPC engine 207, or some other processing unit, uses the modeling data derived from the simulation parameters based on optical and resist properties and from the sub-layers' pattern density calculations. Accordingly, the OPC/PPC takes into account the impact from the sub-layers on the photolithography process, and includes these parameters in the correction algorithm. Then, once OPC/PPC has been performed, the manipulated mask layout of the circuit pattern(s) based on the correction algorithm(s) is outputted.

Figure 5:
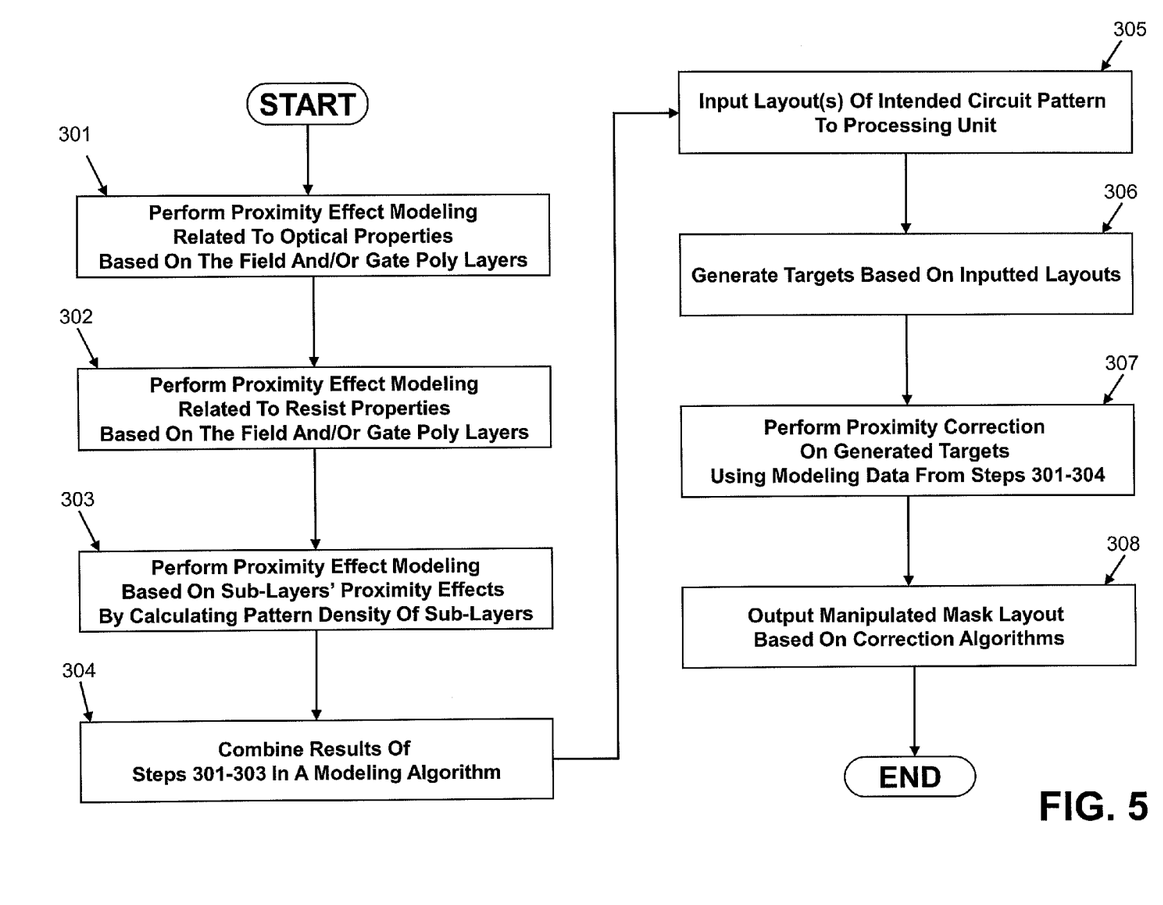
FIG. 5 is a flow chart showing a method for forming a layout of circuit elements on a substrate using optical/process proximity correction, according to an embodiment of the present inventive concept.

Referring to FIG. 5, a flow chart of a method for forming a layout of circuit elements on a substrate using optical/process proximity correction, according to an embodiment of the present inventive concept, is shown. As shown in FIG. 5, in step 301 optical/process proximity effect modeling based on wafer data using simulation parameters related to optical properties based on the field and/or gate poly layers themselves is performed, in step 302 optical/process proximity effect modeling based on wafer data using simulation parameters related to resist properties based on the field and/or gate poly layers themselves is performed, and in step 303, optical/process proximity effect modeling based on wafer data using the sub-layers' optical/process proximity effects is performed by calculating the pattern density of the sub-layers. In step 304, the parameters related to optical and resist properties, and to the sub-layer effect from the calculated pattern density of the sub-layers are then combined in a modeling algorithm, the results to be used during OPC/PPC. It is to be understood that steps 301-303 may be performed simultaneously or separately in different orders. Step 303 may include the step of choosing an appropriate density kernel for the modeling, such as a Top Hat or Gaussian density kernel. Further, the results of the modeling performed in steps 301-304 may be stored in a memory that can be accessed during performance of OPC/PPC.

At step 305, one or more layouts of an intended circuit pattern(s) are inputted to an OPC/PPC engine 207 or some other processing unit, at step 306, a plurality of OPC/PPC targets are generated based on the layout input(s), at step 307, OPC/PPC is performed on the generated targets using the modeling data derived in steps 301-304, and at step 308, the manipulated mask layout of the circuit pattern(s) based on the correction algorithm(s) is outputted. The outputted (corrected) mask layout is used in a photolithography process to form a desired layout of circuit elements on a substrate.

As a result of incorporating the effect of the sub-layers into the OPC/PPC algorithm, across chip line width variation (ACLV) and OPC/PPC accuracy for various patterns is improved. In addition, incorporating the effect of the sub-layers into the OPC/PPC algorithm minimizes reflectivity differences in block layers that can be used to expose or block specific portions of a photoresist layer to or from light, and minimizes etch skew differences in the mask layers used during the patterning processes, thereby reducing unwanted fluctuations in critical dimensions.

Figure 6:
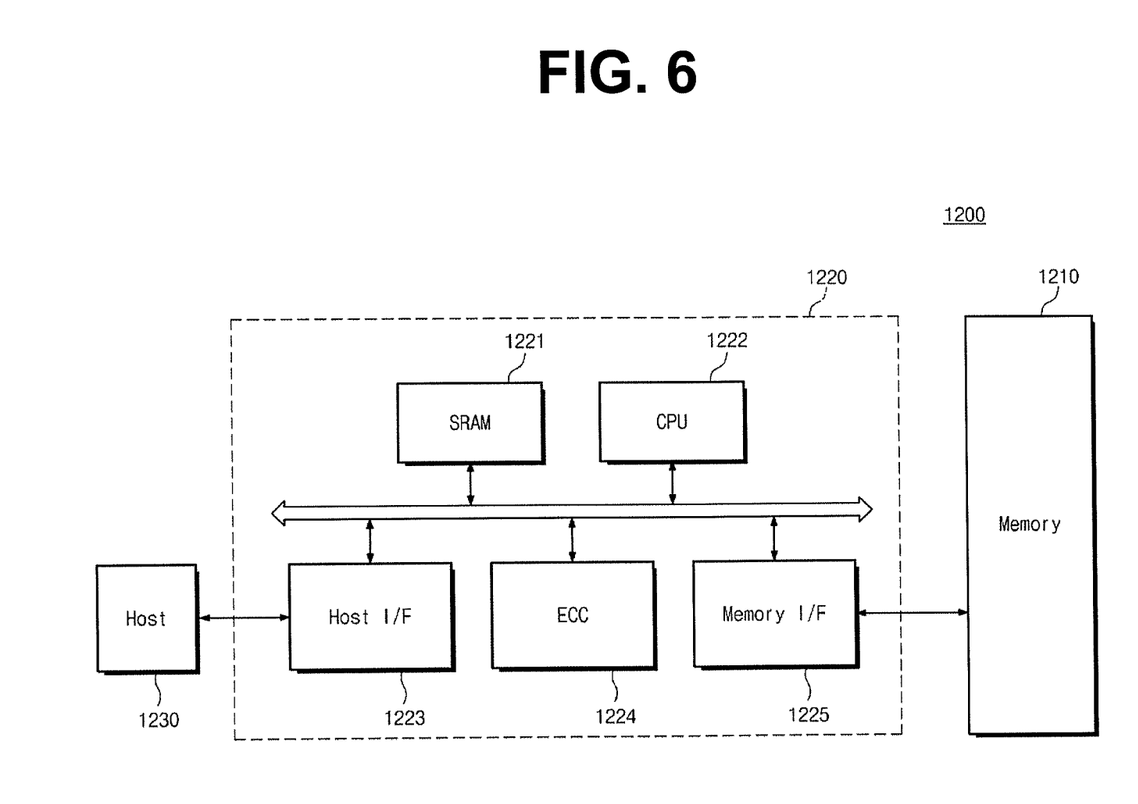
FIG. 6 is a block diagram of a memory card having a semiconductor device manufactured by a method according to an embodiment of the inventive concept.

FIG. 6 is a block diagram of a memory card having a semiconductor device manufactured by a method according to an embodiment of the inventive concept.

Referring to FIG. 6, a semiconductor memory 1210 including semiconductor devices manufactured by a method(s) according to various embodiments of the inventive concept may be applicable to a memory card 1200. For example, the memory card 1200 includes a memory controller 1220 that controls data exchange between a host and the memory 1210. An SRAM 1221 may be used as a working memory of a central processing unit (CPU) 1222. A host interface (I/F) 1223 may have a data exchange protocol of the host connected to the memory card 1200. An error correction code (ECC) 1224 detects and corrects an error in data read from the memory 1210. A memory interface (I/F) 1225 interfaces with the memory 1210. The CPU 1222 performs an overall control operation for data exchange of the memory controller 1220.

Figure 7:
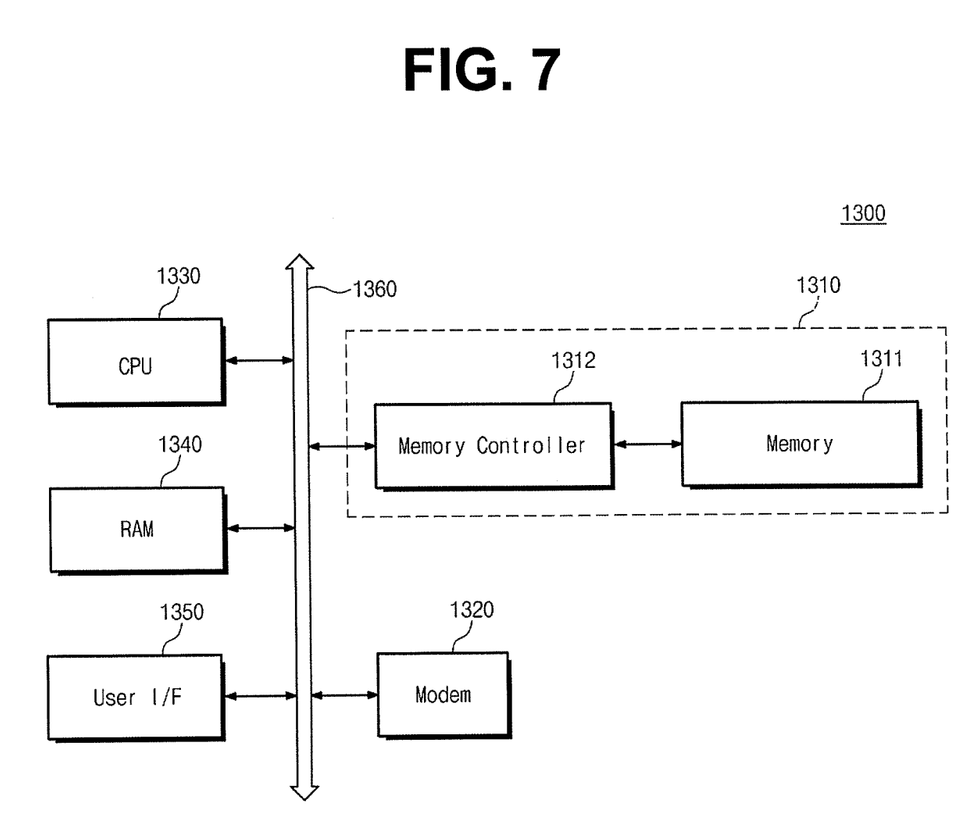
FIG. 7 is a block diagram of an information processing system using a semiconductor device manufactured by a method according to an embodiment of the inventive concept.

FIG. 7 is a block diagram of an information processing system using a semiconductor device manufactured by a method according to an embodiment of the inventive concept.

Referring to FIG. 7, an information processing system 1300 may include a memory system 1310 having a semiconductor device manufactured by a method according to an embodiment of the inventive concept. Examples of the information processing system 1300 include mobile devices and computers. For example, the information processing system 1300 includes a memory system 1310, a modem 1320, a central processing unit (CPU) 1330, a RAM 1340, and a user interface 1350 that are electrically connected to a system bus 1360. The memory system 1310 may include a memory 1311 and a memory controller 1312 and may have substantially the same configuration as the memory card 1200 of FIG. 6. Data processed by the CPU 1330 or data received from an external device may be stored in the memory system 1310. The information processing system 1300 may be provided for memory cards, solid state disks, camera image sensors, and other application chipsets. For example, the memory system 1310 may be configured using a solid state disk (SSD). In this case, the information processing system 1300 can store a large amount of data in the memory system 1310 stably and reliably.

Figure 8:
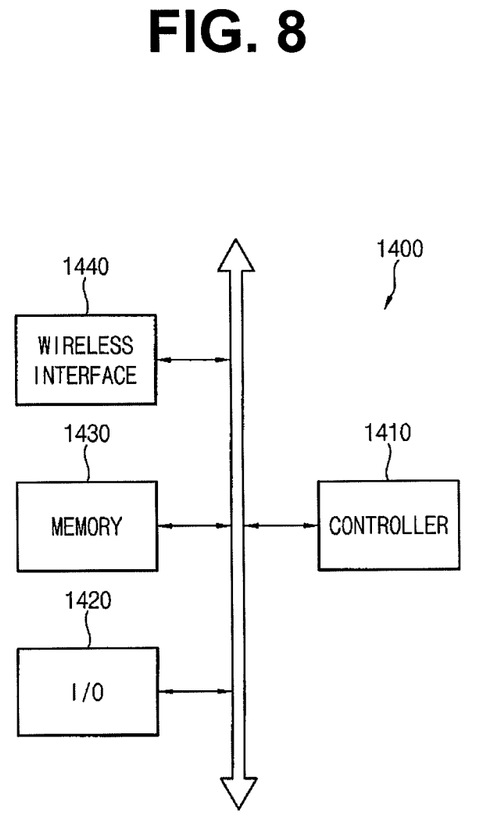
FIG. 8 is a block diagram of an electronic device including a semiconductor device manufactured by a method according to exemplary embodiments of the present inventive concept.

Referring to FIG. 8, an electronic device including a semiconductor device manufactured by a method according to exemplary embodiments of the present inventive concept will be described. The electronic device 1400 may be used in a wireless communication device (e.g., a personal digital assistant, a laptop computer, a portable computer, a web tablet, a wireless telephone, a mobile phone and/or a wireless digital music player) or in any device capable of transmitting and/or receiving information via wireless environments.

The electronic device 1400 includes a controller 1410, an input/output (I/O) device 1420 (e.g., a keypad, a keyboard, and a display), a memory 1430 having a semiconductor device manufactured by a method according to at least one embodiment of the present inventive concept, and a wireless interface 1440. The controller 1410 may include at least one of a microprocessor, a digital signal processor, or a similar processing device. The memory 1430 may be used to store commands executed by the controller 1410, for example. The memory 1430 may be used to store user data. The memory 1430 includes a semiconductor device manufactured by a method according to at least one embodiment of the present inventive concept. The electronic device 1400 may utilize the wireless interface 1440 to transmit/receive data via a wireless communication network. For example, the wireless interface 1440 may include an antenna and/or a wireless transceiver. The electronic device 1400 according to exemplary embodiments may be used in a communication interface protocol of a third generation communication system, e.g., code division multiple access (CDMA), global system for mobile communications (GSM), north American digital cellular (NADC), extended-time division multiple access (E-TDMA) and/or wide band code division multiple access (WCDMA), CDMA2000.

Although exemplary embodiments of the present inventive concept have been described hereinabove, it should be understood that the present inventive concept is not limited to these embodiments, but may be modified by those skilled in the art without departing from the spirit and scope of the present inventive concept.

What is claimed is:

1. A method for forming a circuit layout, comprising:
performing first proximity effect modeling based on photolithography proximity effects caused by a first layer by using a computer, wherein the first layer comprises a gate poly and a field poly formed on a substrate;
performing second proximity effect modeling based on photolithography proximity effects caused by a second layer, wherein the second layer comprises an active layer positioned under the gate poly, and wherein performing the second proximity effect modeling includes calculating a pattern density of the active layer by using a computer;
combining results of the first and second proximity effect modeling using a modeling algorithm by using a computer;
performing proximity correction using the combined results to manipulate a layout of a mask to be used when forming the circuit layout by photolithography by using a computer:
inputting the circuit layer to a processor;
generating a target based on the inputted circuit layout;
performing the proximity correction on the generated target; and
outputting the manipulated mask layout.

2. The method of claim 1, wherein calculating the pattern density is performed using a density kernel.

3. The method of claim 2, wherein the density kernel includes one of a top hat kernel or a Gaussian kernel.

4. The method of claim 1, wherein performing the first proximity effect modeling includes modeling optical and resist properties.

5. The method of claim 4, wherein the optical properties include at least one of a type of a light source, a shape of the light source, a scanner pupil shape and a diffusion length.

6. The method of claim 4, wherein the resist properties include at least one of a mask transmissivity and an acid/base concentration of a resist process.

7. The method of claim 1, further comprising storing the combined results of the first and second proximity effect modeling in a memory.

8. The method of claim 1, wherein the proximity correction is at least one of process proximity correction or optical proximity correction.

9. The method of claim 1, wherein the first and second proximity effect modeling are at least one of process proximity effect modeling or optical proximity effect modeling.

10. The method of claim 1, wherein calculating the pattern density of the active layer is performed with respect to a predetermined point on the gate poly.

11. A computer program product embodied in one or more non-transitory computer readable storage mediums having computer readable program code embodied thereon to perform a method for forming a circuit layout, the method comprising:
    performing first proximity effect modeling based on photolithography proximity effects caused by a first layer, wherein the first layer comprises a gate poly and a field poly formed on a substrate;
    performing second proximity effect modeling based on photolithography proximity effects caused by a second layer, wherein the second layer comprises an active layer positioned under the gate poly, and wherein performing the second proximity effect modeling includes calculating a pattern density of the active layer;
    combining results of the first and second proximity effect modeling using a modeling algorithm;
    performing proximity correction using the combined results to manipulate a layout of a mask used when forming the circuit layout by photolithography:
    inputting the circuit layout to a processor;
    generating a target based on the inputted circuit layout;
    performing the proximity correction on the generated target; and
    outputting the manipulated mask layout.

12. The computer program product of claim 11, wherein calculating the pattern density is performed using a density kernel.

13. The computer program product of claim 12, wherein the density kernel includes one of a top hat kernel or a Gaussian kernel.

14. The computer program product of claim 11, wherein performing the first proximity effect modeling includes modeling optical and resist properties.

15. The computer program product of claim 11, wherein calculating the pattern density of the active layer is performed with respect to a predetermined point on the gate poly.

16. A method for forming a circuit layout, comprising:
    performing process proximity effect modeling based on process proximity effects caused by a sub-layer, wherein the sub-layer comprises an active layer positioned under a gate poly, and wherein performing the process proximity effect modeling includes calculating a pattern density of the sub-layer by using a computer;
    incorporating results of the process proximity effect modeling into a modeling algorithm by using a computer;
    performing proximity correction using the results to manipulate a layout of a mask to be used when forming the circuit layout by photolithography by using a computer:
    inputting the circuit layout to a processor;
    generating a target based on the inputted circuit layout;
    performing the proximity correction on the generated target; and
    outputting the manipulated mask layout.

17. The method of claim 16, wherein calculating the pattern density is performed using a density kernel.

18. The method of claim 17, wherein the density kernel includes one of a top hat kernel or a Gaussian kernel.

19. The method of claim 16, wherein calculating the pattern density of the sub-layer is performed with respect to a predetermined point on the gate poly.

20. A computer system comprising a semiconductor device having a circuit layout manufactured by the method of claim 16, wherein the computer system is one of a personal computer (PC), a personal digital assistant (PDA), an MP3 player, a digital audio recorder, a pen-shaped computer, a digital camera, or a video recorder.

21. A system for transmitting or receiving data, the system comprising:
    a memory device for storing a program; and
    a processor in communication with the memory device, wherein the memory device comprises a circuit layout manufactured by the method of claim 16.

22. The system according to claim 21, wherein the system comprises at least one of a mobile system, a portable computer, a web tablet, a mobile phone, a digital music player, or a memory card.

23. A semiconductor memory card, comprising:
    an interface part that interfaces with an external device;
    a controller that communicates with the interface part and a memory device via address and data buses, wherein the memory device comprises a circuit layout manufactured by the method of claim 16.

24. The method of claim 10, wherein calculating the pattern density of the active layer is performed with respect to a plurality of active layers positioned increasingly farther away from the predetermined point.

25. The computer program product of claim 15, wherein calculating the pattern density of the active layer is performed with respect to a plurality of active layers positioned increasingly farther away from the predetermined point.

26. The method of claim 19, wherein calculating the pattern density of the sub-layer is performed with respect to a plurality of sub-layers positioned increasingly farther away from the predetermined point.

* * * * *